(12) United States Patent
Myung et al.

(10) Patent No.: US 11,049,754 B2
(45) Date of Patent: Jun. 29, 2021

(54) METHOD FOR CONTROLLING SEMICONDUCTOR PROCESS

(71) Applicant: Samsung Electronics Co., Ltd., Suwon-si (KR)

(72) Inventors: Seul Ha Myung, Incheon (KR); Min Joon Park, Seongnam-si (KR); Hyo Sung Kim, Suwon-si (KR); Kyung Hoon Lee, Seoul (KR); Jae Hyun Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 363 days.

(21) Appl. No.: 16/031,321

(22) Filed: Jul. 10, 2018

(65) Prior Publication Data

US 2019/0198373 A1 Jun. 27, 2019

(30) Foreign Application Priority Data

Dec. 26, 2017 (KR) ........................ 10-2017-0179064

(51) Int. Cl.
*H01L 21/683* (2006.01)
*H01L 21/3065* (2006.01)
(Continued)

(52) U.S. Cl.
CPC .... *H01L 21/6833* (2013.01); *H01J 37/32082* (2013.01); *H01J 37/32697* (2013.01); *H01L 21/3065* (2013.01); *H05H 1/0081* (2013.01)

(58) Field of Classification Search
CPC ......... H01L 21/67005; H01L 21/67011; H01L 21/67063; H01L 21/67069; H01L 21/67075; H01L 21/683; H01L 21/6831; H01L 21/6833; H01L 21/687; H01L 21/3065; H01L 21/30655; H01L 23/60; H01L 21/67; H01J 37/32; H01J 37/32009; H01J 37/32082; H01J 37/32091; H01J 37/321; H01J 37/32697; H01J 37/32706; H01J 37/32917; H01J 37/3299;
(Continued)

(56) References Cited

U.S. PATENT DOCUMENTS 5,665,166 A * 9/1997 Deguchi ............. C23C 16/5096
118/723 E
7,224,568 B2 5/2007 Ishimura et al.
(Continued)

FOREIGN PATENT DOCUMENTS

JP 2006-210726 A 8/2006
JP 5094002 B2 9/2012
(Continued)

*Primary Examiner* — Thienvu V Tran
*Assistant Examiner* — Carlos O Rivera-Perez
(74) *Attorney, Agent, or Firm* — Lee IP Law, PC

(57) ABSTRACT

A method of controlling a semiconductor process includes performing a semiconductor process using plasma in a chamber including an electrostatic chuck (ESC) on which a wafer is seated, obtaining an ESC voltage supplied to the ESC, an ESC current detected from the ESC, and bias power supplied to a bias electrode in the chamber, while the semiconductor process is being performed in the chamber, and determining whether a discharge has occurred between the ESC and the wafer using at least one of the ESC voltage, the ESC current, and the bias power.

19 Claims, 9 Drawing Sheets

(51) Int. Cl.
*H05H 1/00* (2006.01)
*H01J 37/32* (2006.01)

(58) Field of Classification Search
CPC .................. H01J 37/32935; H01J 37/32944; H05H 1/00; H05H 1/0006; H05H 1/0081
USPC .. 361/78, 79, 86, 87, 88, 90, 91.1, 92, 93.1, 361/109, 112, 120, 128, 139, 143–145, 361/229, 230–235; 323/274–277; 315/111.01, 111.21–111.91
See application file for complete search history.

(56) References Cited

U.S. PATENT DOCUMENTS

| | | | |
|---|---|---|---|
| 7,514,936 B2 | 4/2009 | Anwar et al. | |
| 7,915,563 B2 | 3/2011 | Tanaka | |
| 7,974,067 B2 | 7/2011 | Ito et al. | |
| 9,170,295 B2 | 10/2015 | Choi | |
| 2004/0031699 A1* | 2/2004 | Shoji | H01L 21/6833 205/791.5 |
| 2004/0228055 A1* | 11/2004 | Pearson | H02J 7/345 361/93.1 |
| 2012/0175060 A1 | 7/2012 | Hudson et al. | |
| 2012/0308341 A1* | 12/2012 | Ishizawa | H01L 21/6833 414/217 |
| 2016/0268108 A1 | 9/2016 | Daniels et al. | |
| 2017/0077002 A1 | 3/2017 | Singlevich et al. | |

FOREIGN PATENT DOCUMENTS

| | | |
|---|---|---|
| JP | 2015-170437 A | 9/2015 |
| KR | 10-2012-0110677 A | 10/2012 |
| KR | 10-2014-0101451 A | 8/2014 |

\* cited by examiner

METHOD FOR CONTROLLING SEMICONDUCTOR PROCESS

CROSS-REFERENCE TO RELATED APPLICATION

Korean Patent Application No. 10-2017-0179064 filed on Dec. 26, 2017 in the Korean Intellectual Property Office, and entitled: "Method for Controlling Semiconductor Process," is incorporated by reference herein in its entirety.

BACKGROUND

1. Field

Embodiments relates to a method for controlling a semiconductor process.

2. Description of the Related Art

Semiconductor devices may be manufactured through various semiconductor processes. Among such semiconductor processes is a process of forcibly generating plasma inside a chamber. Here, for example, a dry etching process of removing a portion of a wafer or a portion of layers formed on the wafer may be performed using plasma generated inside the chamber.

SUMMARY

Embodiments are directed to a method of controlling a semiconductor process, including performing a semiconductor process using plasma in a chamber including an electrostatic chuck (ESC) on which a wafer is seated, obtaining an ESC voltage supplied to the ESC, an ESC current detected from the ESC, and bias power supplied to a bias electrode in the chamber, while the semiconductor process is being performed in the chamber, and determining whether a discharge has occurred between the ESC and the wafer using at least one of the ESC voltage, the ESC current, and the bias power.

Embodiments are also directed to a method of controlling a semiconductor process, including obtaining an electrostatic chuck (ESC) voltage supplied to an ESC on which a wafer is seated, an ESC current detected from the ESC, and bias power supplied to a bias electrode in a chamber, while the chamber is performing a semiconductor process using plasma, comparing magnitudes of the ESC voltage, the ESC current, and the bias power with a reference voltage, a reference current, and reference power, respectively, and when the ESC voltage decreases to be lower than the reference voltage, when the ESC current increases to be higher than the reference current, or when the bias power increases to be higher than the reference power, determining that a discharge has occurred between the wafer and the ESC and interrupting at least one of the ESC voltage and the bias power.

Embodiments are also directed to a method of controlling a semiconductor process, including obtaining an electrostatic chuck (ESC) voltage supplied to an ESC on which a wafer is seated, an ESC current detected from the ESC, and bias power supplied to a bias electrode in a chamber, while the chamber is performing a semiconductor process using plasma, comparing variations in the ESC voltage, the ESC current, and the bias power with first to third reference variations, respectively, and when the variation of the ESC voltage is higher than the first reference variation, when the ESC current is higher than the second reference variation, or when the variation of the bias power is higher than the third reference variation, determining that a discharge has occurred between the wafer and the ESC and interrupting at least one of the ESC voltage and the bias power.

BRIEF DESCRIPTION OF THE DRAWINGS

Features will become apparent to those of skill in the art by describing in detail example embodiments with reference to the attached drawings in which.

DETAILED DESCRIPTION

Hereinafter, example embodiments will be described with reference to the accompanying drawings.

Figure 1:
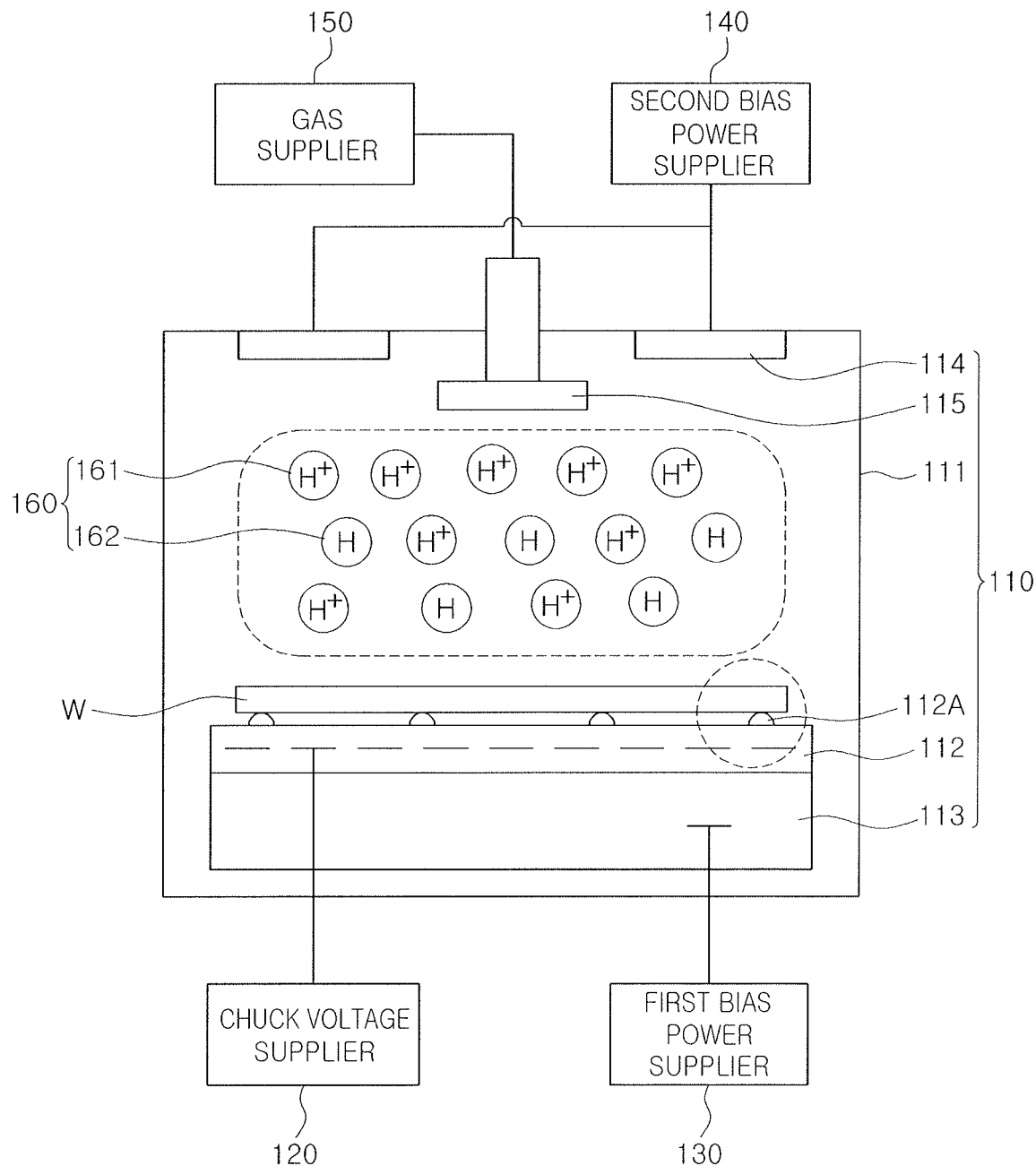
FIGS. 1 and 2 illustrate views of semiconductor processing equipment to which a semiconductor process control method according to an example embodiment may be applied.
Figure 2:
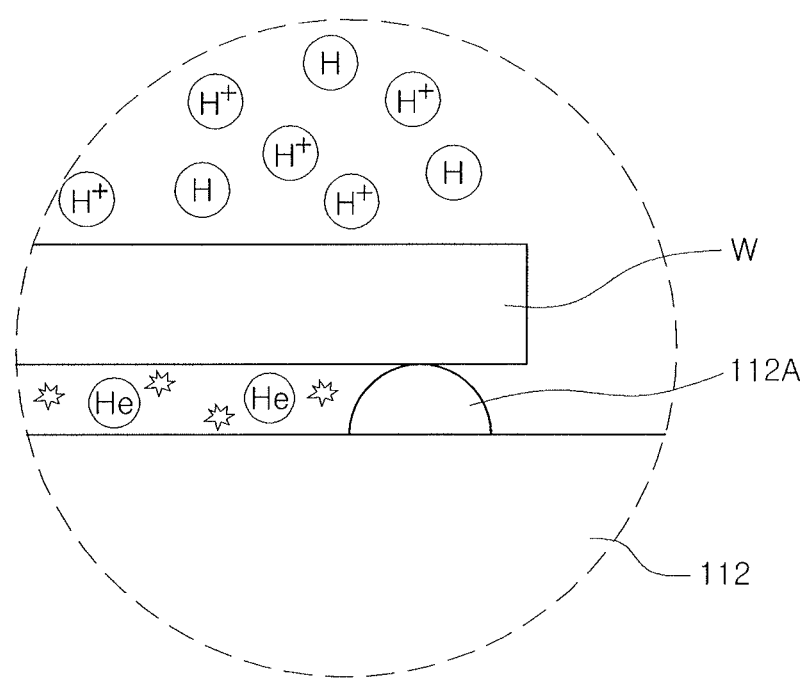

FIGS. 1 and 2 illustrate views of semiconductor processing equipment to which a semiconductor process control method according to an example embodiment may be applied.

Referring to FIG. 1, semiconductor processing equipment 100 according to an example embodiment may be equipment for performing a semiconductor process using plasma. The semiconductor processing equipment 100 may include a chamber 110, a chuck voltage supplier 120, a first bias power supplier 130, a second bias power supplier 140, a gas supplier 150, and the like.

The chamber 110 may include a housing 111, an electrostatic chuck (ESC) 112, a first bias electrode 113, a second bias electrode 114, a gas inlet 115, and the like. A wafer W to be subjected to a semiconductor process may be seated on the electrostatic chuck 112.

In an implementation, for example, a plurality of protrusions 112A having a projection shape may be formed on an upper surface of the electrostatic chuck 112. The wafer W may be seated on the protrusions 112A, and thus, a space may be present between the upper surface of the electrostatic chuck 112 and the wafer W. The space between the upper surface of the electrostatic chuck 112 and the wafer W may be filled with an inert gas such as helium gas or the like for the purpose of cooling the wafer W.

In an example embodiment, the wafer W may be seated on the electrostatic chuck 112 by a voltage supplied to the electrostatic chuck 112 by the chuck voltage supplier 120.

For example, the chuck voltage supplier 120 may supply a constant voltage to the electrostatic chuck 112, and the constant voltage may have a magnitude of hundreds to thousands of volts. The chuck voltage supplier 120 may be connected to an electrode inside the electrostatic chuck 112 to supply a constant voltage and the electrode inside the electrostatic chuck 112 may be formed to face substantially the entire surface of the wafer W.

In order to carry out a semiconductor process, a reaction gas may be introduced through the gas supplier 150. The first bias power supplier 130 may supply first bias power to the first bias electrode 113 located below the electrostatic chuck 112, and the second bias power supplier 140 may supply second bias power to the second bias electrode 114 located above the electrostatic chuck 112. Each of the first bias power supplier 130 and the second bias power supplier 140 may include a radio frequency (RF) power source for supplying bias power.

Plasma 160, including a radical 161 and an ion 162 of a reaction gas, may be generated by the first bias power and the second bias power, and the reaction gas may be activated by the plasma 160 to increase reactivity. For example, in a case in which the semiconductor processing equipment 100 is etching equipment, the radical 161 and the ion 162 of the reaction gas may concentrate on the wafer W as a result of the first bias power supplied by the first bias power supplier 130 to the first bias electrode 113. At least a portion of a semiconductor substrate or layers included in the wafer W may be dry-etched by the radical 161 and the ion 162 of the reaction gas.

A self-bias voltage may be generated above the wafer W by the first bias power and the second bias power supplied to the first bias electrode 113 and the second bias electrode 114, respectively. In an example embodiment, the first bias power supplied to the first bias electrode 113 may be thousands to tens of thousands of watts, and, as a result, a self-bias voltage of minus thousands of volts may be formed above the wafer W.

Thus, a chuck voltage of hundreds to thousands of volts may be supplied to the electrostatic chuck 112 in contact with a lower surface of the wafer W, and a self-bias voltage of minus thousands of volts may be generated on an upper surface of the wafer W. The difference in voltage between above and below the wafer W may cause unintentional discharge from, for example, helium, injected for the purpose of cooling the wafer W in the space between the lower surface of the wafer W and the upper surface of the electrostatic chuck 112. The discharge generated in helium may damage the wafer W, damage semiconductor elements formed on the wafer W, or damage the electrostatic chuck 112.

Referring to FIG. 2, the wafer W may be seated on the protrusions 112A formed on the upper surface of the electrostatic chuck 112. Therefore, a space may be present between the lower surface of the wafer W and the upper surface of the electrostatic chuck 112, and helium (He) may be injected into the space to cool the wafer W. When a high voltage is applied to the electrostatic chuck 112 and high bias powers are applied to perform the semiconductor process using plasma, an unintentional discharge may be generated in helium (He), which may damage the wafer W and/or the electrostatic chuck.

In an example embodiment, a method detects a helium discharge within a short time to minimize damage to the wafer W and/or the electrostatic chuck 112 due to a discharge generated in the helium. According to an example embodiment, changes are detected in one or more of various parameters (such as voltage, current, power, and the like), the changes appearing when a discharge has occurred in helium. Then, one or more of, for example, a voltage, a current, a power, or the like may be interrupted or the semiconductor processing equipment 100 may be shut down according to a detection result to help protect the equipment such as the electrostatic chuck 112, or the like, as well as the wafer W.

Figure 3:
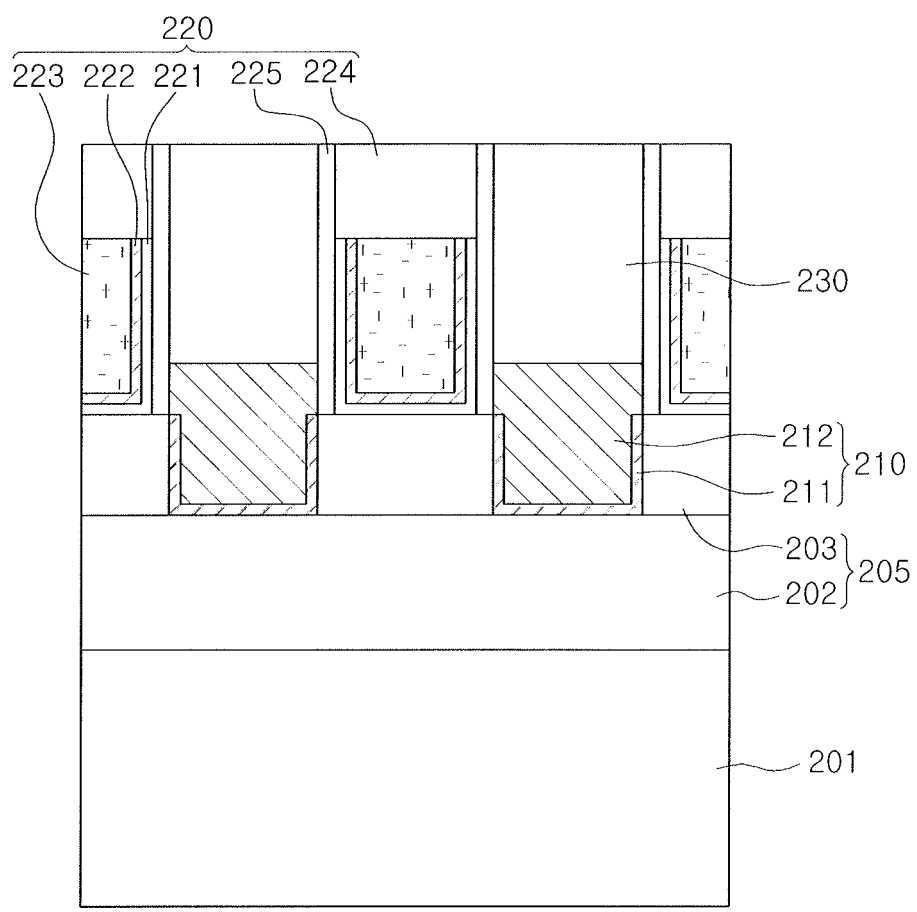
FIG. 3 illustrates a view of a semiconductor wafer to which a semiconductor process control method according to an example embodiment may be applied.

FIG. 3 illustrates a view of a partial region of a semiconductor wafer to which a semiconductor process control method according to an example embodiment may be applied.

Referring to FIG. 3, a semiconductor wafer 200 may include a substrate 201, a fin structure 205, a source/drain region 210, a gate structure 220, an interlayer insulating layer 230, and the like. The fin structure 205 may extend in a direction perpendicular to an upper surface of the substrate 201 and include a first fin structure 202 connected to the substrate 201 and a second fin structure 203.

The gate structure 220 may be formed to intersect the fin structure 205. For example, the gate structure 220 may intersect the fin structure 205, on the first fin structure 202, while covering the second fin structure 203. The gate structure 220 may include, for example, a gate insulating layer 221, a first gate metal layer 222, a second gate metal layer 223, a capping layer 224, a gate spacer 225, and the like.

The gate insulating layer 221 may be disposed between the first gate metal layer 222 and the fin structure 205, and may be conformally formed on an upper surface of the fin structure 205 and an inner side surface of the gate spacer 225. The first gate metal layer 222 may be a work function metal layer and may be formed of titanium, a titanium nitride, or the like. The second gate metal layer 223 may fill a space inside the first gate metal layer 222 and may be formed of tungsten, or the like. The capping layer 224 may be formed of a silicon nitride, a silicon oxynitride, or the like, and may be formed on the gate insulating layer 221, the first gate metal layer 222, and the second gate metal layer 223.

The source/drain region 210 may provide a source region and a drain region of semiconductor devices on both sides of the gate structure 220. The source/drain region 210 may include a first layer 211 and a second layer 212. The first layer 211 may be a region growing from the fin structure 205 and the second layer 212 may be a region growing from the first layer 211. The source/drain region 210 may be doped with N-type or P-type impurities.

The interlayer insulating layer 230 may fill a space between the gate structures 220 and cover the source/drain region 210. The interlayer insulating layer 230 may be formed of a silicon oxide, or the like. In an example embodiment illustrated in FIG. 3, at least a portion of the interlayer insulating layer 230 may be removed to form a trench exposing the source/drain region 210, and the trench may be filled with a conductive material to form a contact.

As a distance between the fin structures 205 and a distance between the gate structures 220 decreases and a height thereof increases, an aspect ratio of structures included in the semiconductor device may increase. As the aspect ratio of the contact formed in the interlayer insulating layer 230 increases, a magnitude of a voltage, a current, and power input to the semiconductor processing equipment during an etching process of removing a portion of the interlayer insulating layer 230 to form the contact may gradually increase. Therefore, a possibility that a discharge will be generated in helium injected between the electrostatic chuck of the semiconductor processing equipment and the semiconductor wafer 200 may increase. As described above, when a discharge has occurred in helium, the electrostatic chuck or the semiconductor wafer 200 may be damaged or a part of a semiconductor device formed on the semiconductor wafer 200 may be damaged to cause a defect.

Figure 4:
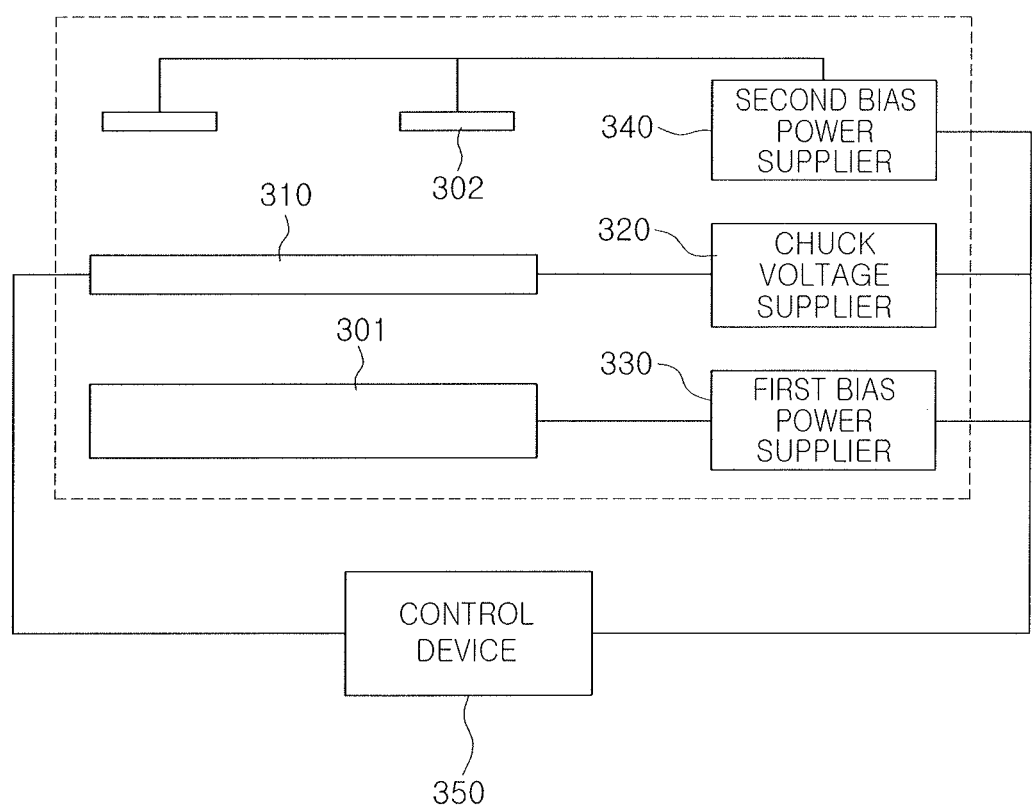
FIG. 4 illustrates a block diagram of semiconductor processing equipment to which a semiconductor process control method according to an example embodiment may be applied.

FIG. 4 illustrates a block diagram of semiconductor processing equipment to which a semiconductor process control method according to an example embodiment may be applied.

Referring to FIG. 4, a semiconductor processing equipment 300 according to an example embodiment may include a first bias electrode 301, a second bias electrode 302, an electrostatic chuck 310, a chuck voltage supplier 320, a first bias power supplier 330, a second bias power supplier 340, a control device 350, and the like. The chuck voltage supplier 320 may supply a chuck voltage to the electrostatic chuck 310 in order to fix a wafer to the electrostatic chuck 310. For example, the chuck voltage may have a magnitude of thousands of volts.

The first bias power supplier 330 and the second bias power supplier 340 may supply power to a first bias electrode 301 and a second bias electrode 302, respectively, and may include a radio frequency (RF) power source. For example, plasma containing radicals, ions, and the like, may be formed above the electrostatic chuck 310 by power supplied to the second bias electrode 302 by the second bias power supplier 340. Also, radicals, ions, and the like, formed above the electrostatic chuck 310 may be accelerated toward the electrostatic chuck 310 by power supplied by the first bias power supplier 330 to the first bias electrode 301. Based on the above-described principle, the semiconductor processing equipment may perform a semiconductor fabrication process such as an etching process, a deposition process, and the like.

The control device 350 may control a general operation of the semiconductor processing equipment 300. In an example embodiment, the control device 350 may detect at least one of an electrostatic chuck voltage supplied by the chuck voltage supplier 320 to the electrostatic chuck 310, an electrostatic chuck current flowing in the electrostatic chuck 310, first bias power supplied by the first bias power supplier 330 to the first bias electrode 301, and second bias power supplied to the second bias electrode 302 by the second bias power supplier 340. The control device 350 may determine whether an unintentional discharge has occurred in helium injected between the wafer and the electrostatic chuck 310 using the electrostatic chuck voltage, the electrostatic chuck current, the first bias power, and the second bias power. In an example embodiment, the control device 350 may detect whether a discharge has occurred in helium between the wafer and the electrostatic chuck 310 by detecting a bias voltage or a bias current from each of the first bias power and the second bias power.

In an example embodiment, the control device 350 may determine whether a discharge has occurred in helium between the wafer and the electrostatic chuck 310 by comparing at least one of the electrostatic chuck voltage, the electrostatic chuck current, the first bias power, and the second bias power with a reference value. The control device 350 may determine that a discharge has been generated when any one of the following is determined: the electrostatic chuck voltage decreases to be lower than a reference voltage, or the electrostatic chuck current increases to be higher than a reference current, or at least one of the first and second bias powers becomes higher than a reference power.

Also, in an example embodiment, the control device 350 may determine whether a discharge has occurred in helium between the wafer and the electrostatic chuck 310 by comparing, with a reference variation, at least one variation of: the electrostatic chuck voltage, the electrostatic chuck current, the first bias power, or the second bias power. When a variation in the electrostatic chuck voltage is higher than a first reference variation, when a variation in the electrostatic chuck current is higher than a second reference variation, or when a variation in at least one of the first and second bias powers is higher than a third reference variation, the control device 350 may determine that a discharge has been generated.

When it is determined that a discharge has occurred in helium between the wafer and the electrostatic chuck 310, the control device 350 may stop an operation of the chuck voltage supplier 320, the first bias power supplier 330, and the second bias power supplier 340, or shut down the semiconductor processing equipment 300. For example, when a discharge in helium is determined on the basis of a decrease in the electrostatic chuck voltage or an increase of the electrostatic chuck current, the control device 350 may shut down the semiconductor processing equipment 300 or stop the operation of the chuck voltage supplier 320. Also, when a discharge in helium is determined on the basis of an increase in the first bias power or the second bias power, the control device 350 may shut down the semiconductor processing equipment 300, or stop the operation of the first bias power supplier 330 or the second bias power supplier 340.

Figure 5:
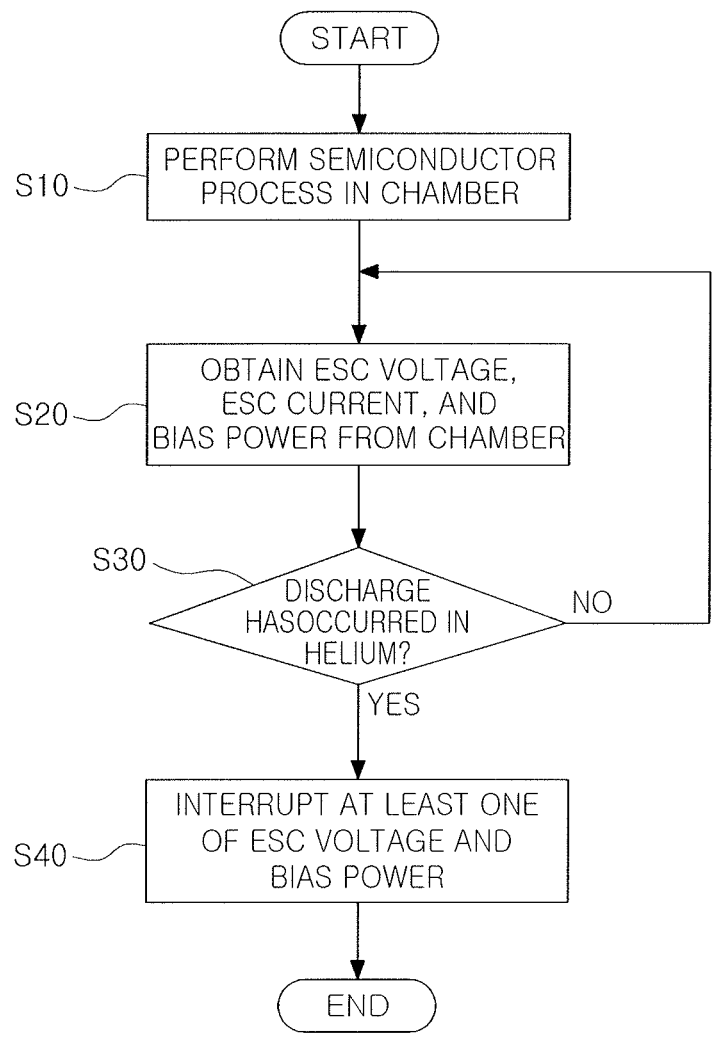
FIG. 5 illustrates a flowchart of a method of controlling a semiconductor process according to an example embodiment.

FIG. 5 illustrates a flowchart of a method of controlling a semiconductor process according to an example embodiment.

Referring to FIG. 5, a method of controlling a semiconductor process according to an example embodiment may begin with performing a semiconductor process in a chamber included in the semiconductor processing equipment in operation S10. In an example embodiment, the semiconductor process, as a process using plasma including radicals, ions, and the like, of a source gas, may be an etching process or a deposition process. In order to carry out the semiconductor process using plasma, a predetermined electrostatic chuck voltage may be supplied to the electrostatic chuck in the chamber, and bias power may be supplied to the bias electrodes in the chamber.

During the semiconductor process, the control device of the semiconductor processing equipment may detect an electrostatic chuck voltage and an electrostatic chuck current from the electrostatic chuck, and detect bias power supplied to the bias electrodes in operation S20. The control device may detect the electrostatic chuck voltage, the electrostatic chuck current, and the bias power in real time or once per predetermined period. The control device may determine whether an unintentional discharge has occurred between the wafer and the electrostatic chuck by comparing each of the electrostatic chuck voltage, the electrostatic chuck current, and the bias power with a reference value or a reference variation in operation S30.

In an example embodiment, the control device may determine whether a discharge has occurred between the wafer and the electrostatic chuck by comparing two or more parameters among the electrostatic chuck voltage, the electrostatic chuck current, and the bias power with reference values, respectively. For example, when the electrostatic chuck voltage is reduced to below a reference voltage and the electrostatic chuck current is increased to be higher than a reference current, the control device may determine that a discharge has been generated between the wafer and the electrostatic chuck. Also, when the electrostatic chuck voltage is decreased to below the reference voltage and the bias power is increased to be higher than a reference power, the control device may determine that a discharge has been generated in helium. Further, when the electrostatic chuck current is increased to be higher than the reference current and the bias power is increased to be higher than the reference power, the control device may determine that a discharge has been generated between the wafer and the electrostatic chuck. The control device may provide a user interface for setting the reference voltage, the reference current, and the reference power to a manager of the semiconductor processing equipment.

In another example embodiment, the control device may determine whether a discharge has occurred between the wafer and the electrostatic chuck by comparing variations of two or more parameters among the electrostatic chuck voltage, the electrostatic chuck current, and the bias power with a reference variation. For example, if a variation in the electrostatic chuck voltage is higher than a first reference variation and a variation in the electrostatic chuck current is higher than a second reference variation, the control device may determine that a discharge has been generated between the wafer and the electrostatic chuck. Also, if the electrostatic chuck voltage is higher than the second reference variation and a variation in the bias power is higher than a third reference variation, the control device may determine that a discharge has been generated in helium. Also, if a variation in the bias power is higher than the third reference variation and a variation in the electrostatic chuck voltage is higher than the first reference variation, the control device may determine that a discharge has been generated between the wafer and the electrostatic chuck. The control device may provide a user interface for setting the first to third reference variations to the manager of the semiconductor processing equipment.

An inert gas such as helium (He), or the like, may be injected between the wafer and the electrostatic chuck for the purpose of cooling the wafer. If it is determined in operation S30 that a discharge has been occurred between the wafer and the electrostatic chuck, the control device may interrupt at least one of the electrostatic chuck voltage and the bias power or shut down the semiconductor processing equipment in operation S40. Meanwhile, if it is not determined in step S30 that a discharge has been occurred between the wafer and the electrostatic chuck, the control device may continue to detect the electrostatic chuck voltage, the electrostatic chuck current, and the bias power, without taking any protective measures.

The method of controlling a semiconductor process described above with reference to FIG. 5 may be realized by software executable in the control device of the semiconductor processing equipment or hardware installed in the control device. In an example embodiment, the electrostatic chuck voltage, the electrostatic chuck current, the bias power, and the like, are values which are generally monitored in the chamber in which an etching process or a deposition process using plasma is performed. In an implementation, aspects of the method of controlling a semiconductor process according to an example embodiment may be implemented in software on the control device.

Figure 6:
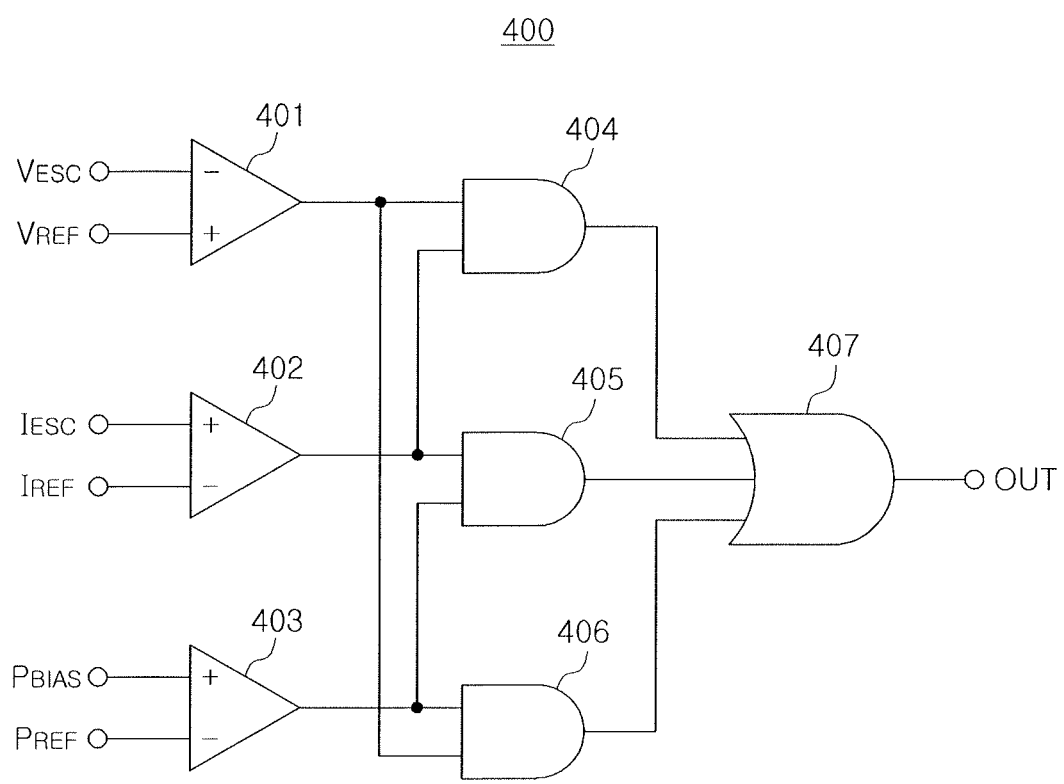
FIGS. 6 and 7 illustrate circuit diagrams of a method of controlling a semiconductor process according to an example embodiment.
Figure 7:
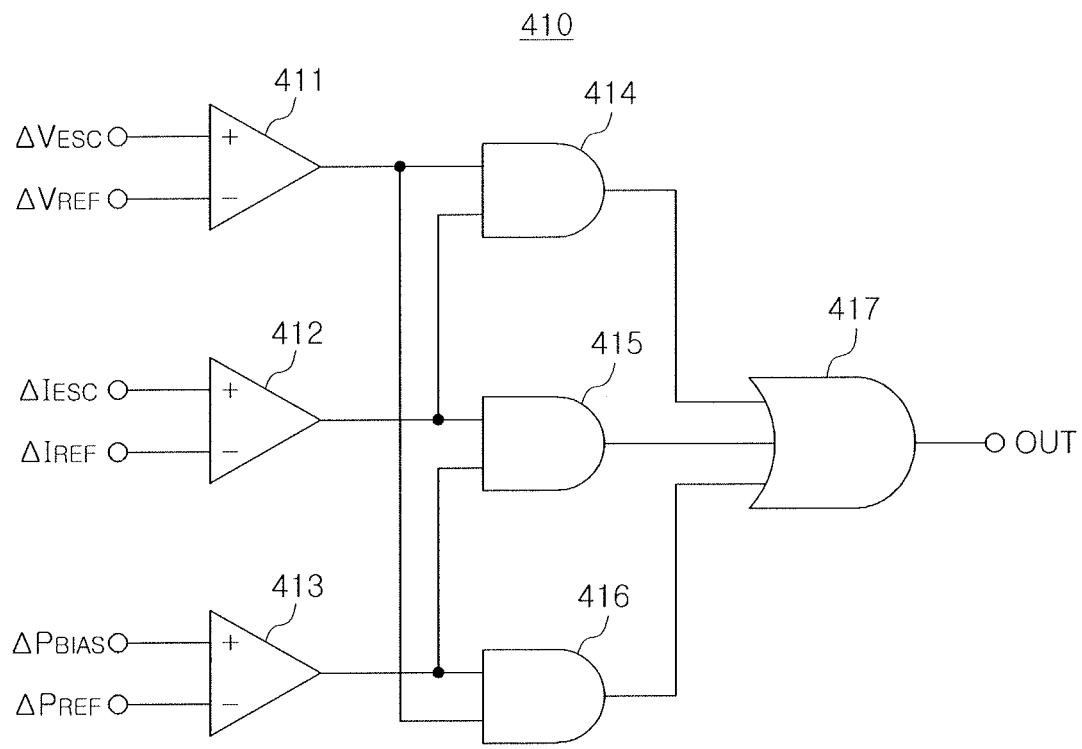

FIG. 6 and FIG. 7 illustrate circuit diagrams provided to explain a method of controlling a semiconductor process according to an example embodiment.

Referring to FIG. 6, a discharge detection circuit 400 according to an example embodiment includes first to third comparators 401 to 403, first to third AND gates 404 to 406, and an OR gate 407. The first to third comparators 401 to 403 may compare an electrostatic chuck voltage $V_{ESC}$, an electrostatic chuck current $I_{ESC}$, and bias power $P_{BIAS}$ with a reference voltage $V_{REF}$, a reference current $I_{REF}$, and reference power $P_{REF}$, respectively.

The first comparator 401 may output a high logic value if the electrostatic chuck voltage $V_{ESC}$ decreases to be lower than the reference voltage $V_{REF}$. The second comparator 402 may output a high logic value if the electrostatic chuck current $I_{ECS}$ increases to be equal to or greater than the reference current $I_{REF}$. The third comparator 403 may output a high logic value if the bias power $P_{BIAS}$ increases to be higher than the reference power $P_{REF}$.

The first AND gate 404 may output a high logic value when both the first comparator 401 and the second comparator 402 output a high logic value. Thus, if the electrostatic chuck voltage $V_{ESC}$ decreases to be lower than the reference voltage $V_{REF}$ and the electrostatic chuck current $I_{ESC}$ increases to be higher than the reference current $I_{REF}$, the first AND gate 404 may output a high logic value.

The second AND gate 405 may output a high logic value when both the second comparator 402 and the third comparator 403 output a high logic value. Thus, if the electrostatic chuck current $I_{ESC}$ increases to be higher than the reference current $I_{REF}$ and the bias power $P_{BIAS}$ increases to be higher than the reference power $P_{REF}$, the second AND gate 405 may output a high logic value.

The third AND gate 406 may output a high logic value when both the third comparator 403 and the first comparator 401 output a high logic value. Thus, if the bias power $P_{BIAS}$ increases to be higher than the reference power $P_{REF}$ and the electrostatic chuck voltage $V_{ESC}$ decreases to be lower than the reference voltage $V_{REF}$, the third AND gate 406 may output a high logic value.

The output signal OUT of the OR gate 407 may have a high logic value when any one of the first to third AND gates 404 to 406 has a high logic value. An output terminal of the OR gate 407 may be connected to a power switch of a chuck voltage supplier and/or a bias power supplier. For example, the power switch of the chuck voltage supplier and/or the bias power supplier may be turned off when an output signal OUT of the OR gate 407 has a high logic value. In another implementation, the output terminal of the OR gate 407 may be connected to a power switch of the chamber included in the semiconductor processing equipment, and when the output signal OUT of the OR gate 407 has a high logic value, the power switch of the chamber may be turned off.

Referring to FIG. 7, a discharge detection circuit 410 according to an example embodiment may include first to third comparators 411 to 413, first to third AND gates 414 to 416, and an OR gate 417. The first to third comparators 401 to 403 may compare a variation $\Delta V_{ESC}$ of an electrostatic chuck voltage, a variation $\Delta I_{ESC}$ of an electrostatic chuck current, and a variation $\Delta P_{BIAS}$ of bias power with a first reference variation $\Delta V_{REF}$, a second reference variation $\Delta I_{REF}$, and a third reference variation $\Delta P_{REF}$, respectively.

The first comparator 411 may output a high logic value if the variation $\Delta V_{ESC}$ of the electrostatic chuck voltage is higher than the first reference variation $\Delta V_{REF}$, and the second comparator 412 may output a high logic value if the variation $\Delta I_{ESC}$ of the electrostatic chuck current is higher than the second reference variation $\Delta I_{REF}$. The third comparator 413 may output a high logic value if the variation $\Delta P_{BIAS}$ of the bias power is higher than the third reference variation $\Delta P_{REF}$.

The first AND gate 414 may output a high logic value when both the first comparator 411 and the second comparator 412 output a high logic value. Thus, if the variation $\Delta V_{ESC}$ of the electrostatic chuck voltage is higher than the first reference variation $\Delta V_{REF}$ and the variation $\Delta I_{ESC}$ of the electrostatic chuck current is higher than the second reference variation $\Delta I_{REF}$, the first AND gate 414 may output a high logic value.

The second AND gate 415 may output a high logic value when both the second comparator 412 and the third comparator 413 output a high logic value. Thus, when the variation $\Delta I_{ESC}$ of the electrostatic chuck current is higher than the second reference variation $\Delta I_{REF}$ and the variation $\Delta P_{BAIS}$ of the bias power is higher than the third reference variation $\Delta P_{REF}$, the second AND gate 415 may output a high logic value.

The third AND gate 416 may output a high logic value when both the third comparator 413 and the first comparator 411 output a high logic value. Thus, if the variation $\Delta P_{BIAS}$ of the bias power is higher than the third reference variation $\Delta P_{REF}$ and the variation $\Delta V_{ESC}$ of the electrostatic chuck voltage is higher than the first reference variation $\Delta V_{REF}$, the third AND gate 416 may output a high logic value.

The output signal OUT of the OR gate 417 may have a high logic value when any one of the first to third AND gates 414 to 416 has a high logic value. An output terminal of the OR gate 417 may be connected to a power switch of a chuck voltage supplier, a bias power supplier, and/or the chamber. For example, the power switch of the chuck voltage supplier, the bias power supplier, and/or the chamber may be turned off when the output signal OUT has a high logic value.

The semiconductor processing equipment according to an example embodiment may include one or more of the discharge detection circuits 400 and 410 according to the example embodiments described above with reference to FIGS. 6 and 7. In a case in which the semiconductor processing equipment includes both the discharge detection circuits 400 and 410 according to the example embodiments described above with reference to FIGS. 6 and 7, the output signal OUT of each of the discharge detection circuits 400 and 410 may be input to the single OR gate. The output terminal of the OR gate may be connected to the power switch of the chuck voltage supplier, the bias power supplier, and/or the chamber, and when the output signal of the OR gate has a high logic value, the power switch of the chuck voltage supplier, the bias power supplier, and/or the chamber may be turned off.

Figure 8:
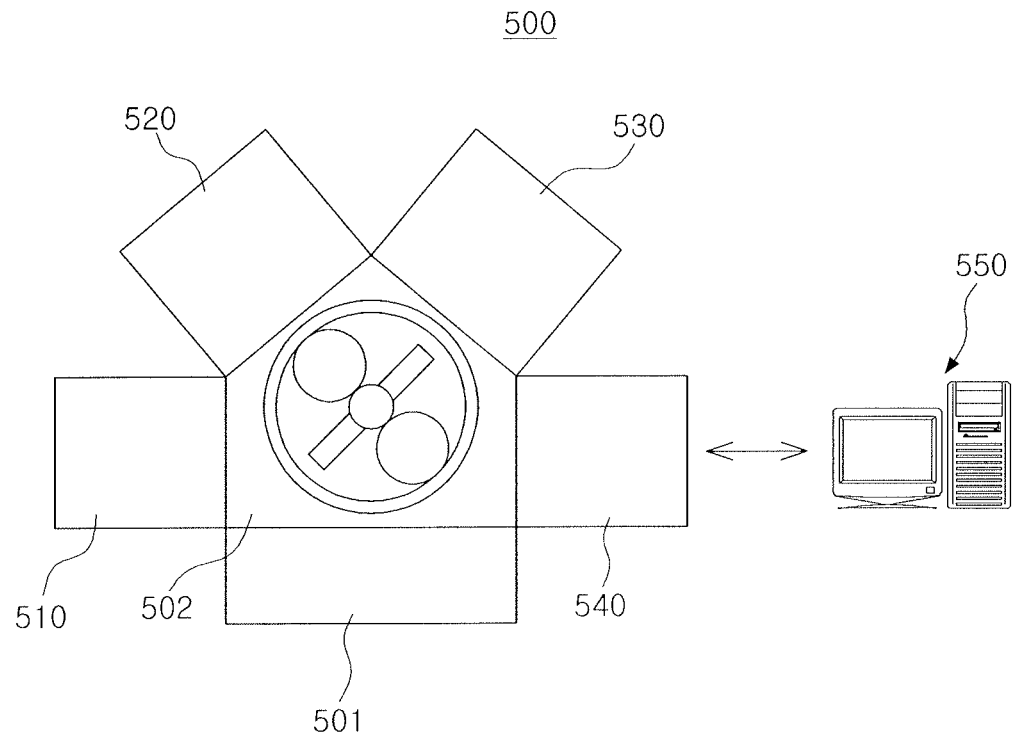
FIG. 8 illustrates a view of semiconductor processing equipment to which a semiconductor process control method according to an example embodiment may be applied.

FIG. 8 illustrates a view of semiconductor processing equipment to which a semiconductor process control method according to an example embodiment may be applied.

Referring to FIG. 8, a semiconductor processing equipment 500 according to an example embodiment may include a plurality of chambers 510 to 540. The plurality of chambers 510 to 540 may receive a wafer through a transfer chamber 501 and a load lock chamber 502 and perform a semiconductor process. For example, at least one of the plurality of chambers 510 to 540 may be a plasma processing chamber that generates plasma containing radicals and ions of a source gas to conduct an etching or deposition process.

In an example embodiment, a transfer robot may be provided inside the transfer chamber 501, and the transfer robot may transfer wafers to the load lock chamber 502. The load lock chamber 502 may also include a transfer robot, and the transfer robot may transfer wafers to the plurality of chambers 510 to 540 or shift wafers between the plurality of chambers 510 to 540.

A control device 550 may monitor operations of the plurality of chambers 510 to 540, the transfer chamber 501, and the load lock chamber 502. For example, the control device 550 may detect an electrostatic chuck current from the electrostatic chuck while monitoring an electrostatic chuck voltage, bias power, and the like, supplied to the plasma processing chamber, among the plurality of chambers 510 to 540. The control device 550 may compare the electrostatic chuck voltage, the electrostatic chuck current, and/or the bias power with a reference value or compare a variation in the electrostatic chuck voltage, a variation in the electrostatic chuck current, and/or a variation in the bias power with a reference variation.

The control device 550 may interrupt supply of the electrostatic chuck voltage and/or bias power on the basis of a result of the comparison, or stop an operation of the chamber (among the plurality of chambers 510 to 540) in which a rapid change in the electrostatic chuck voltage, the electrostatic chuck current, and/or the bias power is detected. The rapid change in the electrostatic chuck voltage, electrostatic chuck current, and/or bias power may indicate that an unintentional discharge has been generated in an inert gas, for example, helium (He), or the like, injected between the electrostatic chuck and the wafer in the chamber. The control device 550 may stop the operation of the chamber in which the rapid change in the electrostatic chuck voltage, the electrostatic chuck current, and/or the bias power is detected, or interrupt the electrostatic chuck voltage and/or the bias power supplied to the chamber to protect the chamber and the wafer.

Figure 9A:
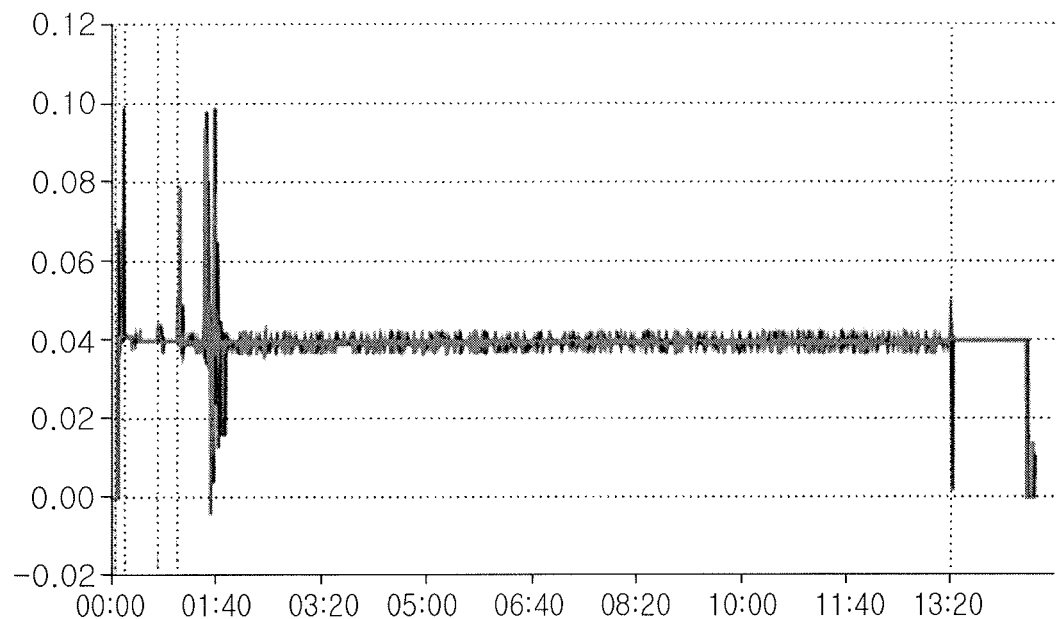
FIGS. 9A, 9B, and 10 are graphs provided to illustrate a method of controlling a semiconductor process according to an example embodiment.
Figure 9B:
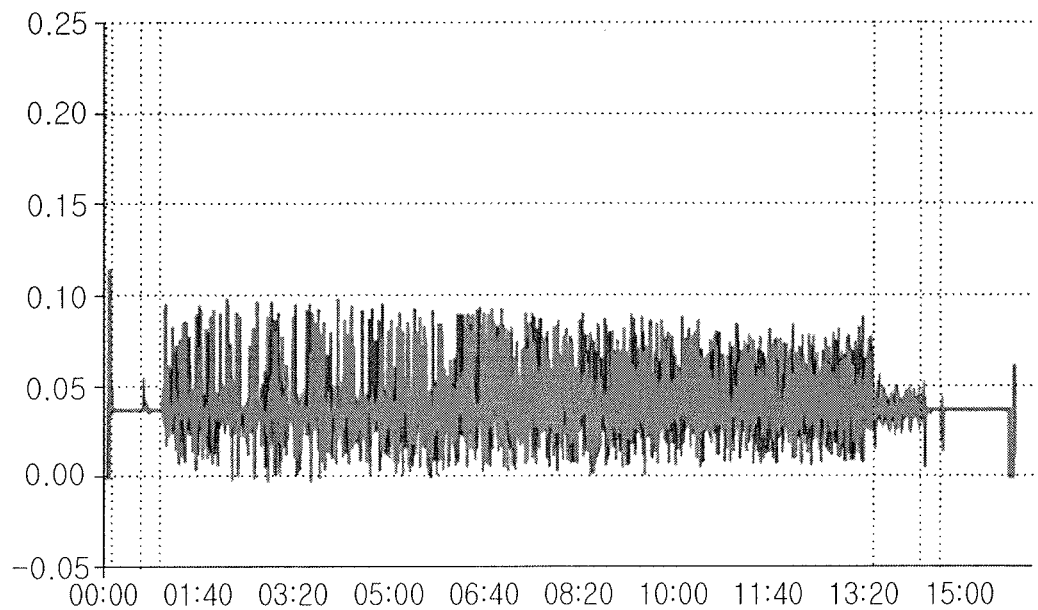
Figure 10:
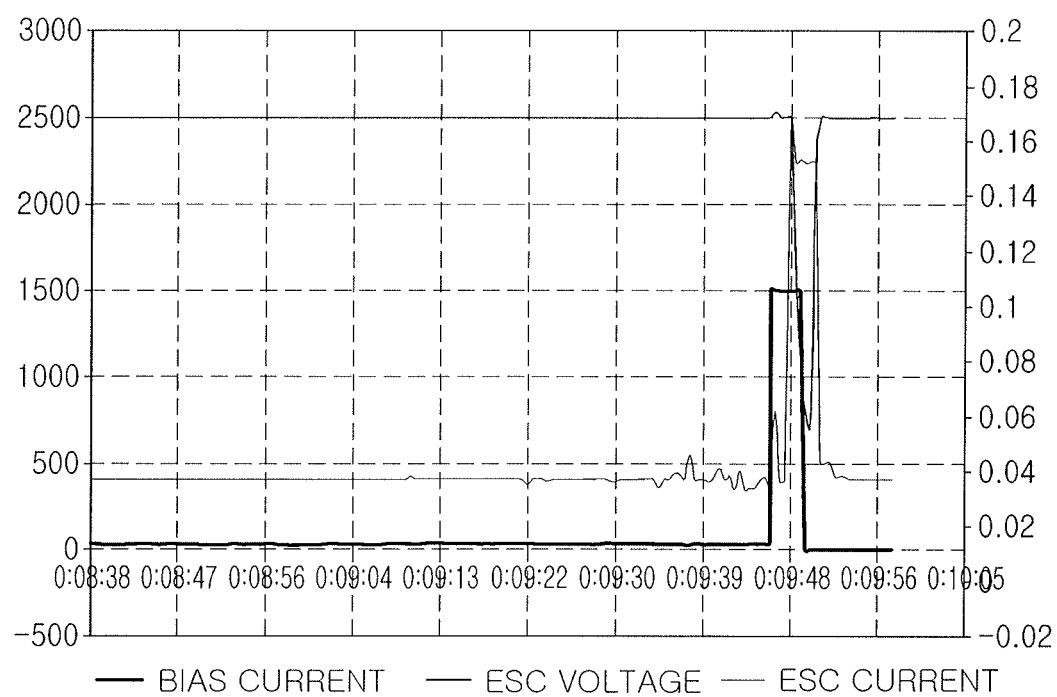

FIGS. 9A, 9B, and 10 are graphs provided to illustrate a method of controlling a semiconductor process according to an example embodiment.

FIG. 9A is a graph illustrating an electrostatic chuck current detected from the electrostatic chuck when no discharge was generated in an inert gas injected between the electrostatic chuck and the wafer inside the chamber. Meanwhile, FIG. 9B is a graph illustrating an electrostatic chuck current detected when a discharge was generated in the inert gas injected between the electrostatic chuck and the wafer inside the chamber.

Referring to FIG. 9A, it can be seen that the electrostatic chuck current has a relatively stable value over time. Meanwhile, referring to FIG. 9B (for the case when a discharge was generated in the inert gas), it can be seen that the electrostatic chuck current repeatedly increases and decreases with reference to a central value, fluctuating significantly. Accordingly, the semiconductor processing equipment may determine whether a discharge has occurred in the inert gas injected between the electrostatic chuck and the wafer in the chamber by detecting the increase or decrease in the electrostatic chuck current.

FIG. 10 is a graph illustrating changes in an electrostatic chuck voltage, an electrostatic chuck current, and a bias power when a discharge has occurred in an inert gas injected between the electrostatic chuck and the wafer in a chamber. Referring to the example embodiment illustrated in FIG. 10, it can be seen that the bias power and the electrostatic chuck current increase and the electrostatic chuck voltage decreases in the vicinity of a process time of about 9 minutes and 50 seconds. Thus, generation of the discharge in the inert gas injected between the electrostatic chuck and the wafer in the chamber may lead to the increase in the electrostatic chuck current and bias power and the decrease in the electrostatic chuck voltage.

In an example embodiment, whether a discharge occurred in an inert gas injected between the electrostatic chuck and the wafer in the chamber may be quickly detected by detecting at least one of an electrostatic chuck voltage, an electrostatic chuck current, and a bias power and comparing the detected voltage, current, or power with a reference value or a reference variation. Also, when a discharge of the inert gas is detected, the electrostatic chuck voltage and/or bias power supplied to the chamber may be shut off. Therefore, the wafer and the chamber may be effectively protected by automatically detecting a discharge of the inert gas and stopping the process, without a separate checking operation by an operator.

By way of summation and review, when the semiconductor process using plasma is in progress, radicals and ions may be formed inside the chamber. The radicals and ions may be formed by bias power supplied to the chamber.

As described above, embodiments may provide a method of controlling a semiconductor process that detects a discharge in an inert gas that may occur between a wafer and an electrostatic chuck during a dry etching process.

According to an example embodiment, whether a discharge has occurred between the wafer and the electrostatic chuck may be determined by detecting a voltage or a current in various positions inside the chamber in which the semiconductor process is performed using plasma and comparing the detected voltage or current with a reference value. Therefore, generation of a discharge may be effectively detected, and when a discharge has occurred, a voltage supplied to the electrostatic chuck or bias power supplied to the chamber may be interrupted, effectively protecting the wafer and the electrostatic chuck.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of controlling a semiconductor process, the method comprising:
   performing a semiconductor process using plasma in a chamber including an electrostatic chuck (ESC) on which a wafer is seated;
   obtaining an ESC voltage supplied to the ESC, an ESC current detected from the ESC, and bias power supplied to a bias electrode in the chamber, while the semiconductor process is being performed in the chamber; and
   determining whether a discharge has occurred between the ESC and the wafer when the ESC voltage decreases below a reference voltage and the ESC current increases above a reference current, when the ESC current increases above the reference current and the bias power increases above a reference power, or when the bias power increases above the reference power and the ESC voltage decreases below the reference voltage.

2. The method as claimed in claim 1, further comprising:
   when it is determined that the discharge has occurred between the ESC and the wafer, interrupting at least one of the ESC voltage and the bias power or shutting down the chamber.

3. The method as claimed in claim 1, further comprising:
   providing a user interface for setting at least one of the reference voltage, the reference current, and the reference power.

4. The method as claimed in claim 1, wherein
   when the ESC voltage decreases to be lower than the reference voltage and the ESC current increases to be higher than the reference current, it is determined that the discharge has occurred between the ESC and the wafer.

5. The method as claimed in claim 1, wherein
   when the ESC voltage decreases to be lower than the reference voltage and the bias power increases to be higher than the reference power, it is determined that the discharge has occurred between the ESC and the wafer.

6. The method as claimed in claim 1, wherein
   when the ESC current increases to be higher than the reference current and the bias power increases to be higher than the reference power, it is determined that the discharge has occurred between the ESC and the wafer.

7. The method as claimed in claim 1, wherein
   the ESC includes a plurality of protrusions protruding toward the wafer so as to be in contact with a lower surface of the wafer.

8. The method as claimed in claim 7, wherein
   determining whether the discharge has occurred between the ESC and the wafer includes determining that a discharge has occurred in a space between the plurality of protrusions and the lower surface of the wafer, wherein the space is filled with helium (He).

9. The method as claimed in claim 1, wherein the chamber includes a plurality of chambers, and determining whether the discharge has occurred between the ESC and the wafer included in each of the plurality of chambers is performed using at least one value among the ESC voltage, the ESC current, and the bias power obtained from each of the plurality of chambers.

10. The method as claimed in claim 9, wherein
    the wafer is supplied to the plurality of chambers by a single transfer chamber.

11. The method as claimed in claim 1, further comprising:
    detecting at least one of a bias voltage and a bias current from the bias power; and
    comparing at least one of the bias voltage and the bias current with a reference value to determine whether the discharge has occurred between the ESC and the wafer.

12. The method as claimed in claim 1, wherein
    an etching process using plasma is performed in the chamber.

13. The method as claimed in claim 1, wherein
    a deposition process using plasma is performed in the chamber.

14. The method as claimed in claim 1, wherein
    the bias power is supplied by a radio frequency (RF) power source connected to the bias electrode.

15. The method as claimed in claim 1, wherein
    determining that the discharge has occurred between the ESC and the wafer, by a discharge detection circuit, and
    the discharge detection circuit comprises a first comparator comparing the ESC voltage with the reference voltage, a second comparator comparing the ESC current with the reference current, a third comparator comparing the bias power with the reference power.

16. The method as claimed in claim 15, wherein the discharge detection circuit comprises a first AND gate that outputs a high logic value when both of the first comparator and the second comparator output a high logic value, a second AND gate that outputs a high logic value when both of the second comparator and the third comparator output a high logic value, a third AND gate that outputs a high logic value when both of the third comparator and the first comparator output a high logic value, and an OR gate outputs a high logic value when at least one of the first to third AND gates outputs a high logic value.

17. A method of controlling a semiconductor process, the method comprising:
   obtaining an electrostatic chuck (ESC) voltage supplied to an ESC on which a wafer is seated, an ESC current detected from the ESC, and a bias power supplied to a bias electrode inside a chamber, while the chamber is performing a semiconductor process using plasma;
   comparing variations of the ESC voltage, the ESC current, and the bias power with first to third reference variations, respectively; and
   when the variation of the ESC voltage is higher than the first reference variation and the variation of the ESC current is higher than the second reference variation, when the variation of the ESC current is higher than the second reference variation and the variation of the bias power is higher than the third reference variation, or when the variation of the bias power is higher than the third reference variation and the variation of the ESC voltage is higher than the first reference variation, determining that a discharge has occurred between the wafer and the ESC and interrupting at least one of the ESC voltage and the bias power.

18. The method as claimed in claim 17, wherein
   determining that the discharge has occurred between the ESC and the wafer, by a discharge detection circuit, and
   the discharge detection circuit comprises a first comparator comparing the variation of the ESC voltage with the first reference variation, a second comparator comparing the variation of the ESC current with the second reference variation, a third comparator comparing the variation of the bias power with the third reference variation.

19. The method as claimed in claim 18, wherein the discharge detection circuit comprises a first AND gate that outputs a high logic value when both of the first comparator and the second comparator output a high logic value, a second AND gate that outputs a high logic value when both of the second comparator and the third comparator output a high logic value, a third AND gate that outputs a high logic value when both of the third comparator and the first comparator output a high logic value, and an OR gate outputs a high logic value when at least one of the first to third AND gates outputs a high logic value.

* * * * *